United States Patent
Martinez et al.

(10) Patent No.: US 10,179,254 B2
(45) Date of Patent: Jan. 15, 2019

(54) CAPACITOR STRUCTURE WITH ACOUSTIC NOISE SELF-CANCELING CHARACTERISTICS

(71) Applicant: Apple Inc., Cupertino, CA (US)

(72) Inventors: Paul A. Martinez, Morgan Hill, CA (US); Jason C. Sauers, Cupertino, CA (US); Shawn X. Arnold, Santa Cruz, CA (US)

(73) Assignee: aPPLE INC., Cupertino, CA (US)

( * ) Notice: Subject to any disclaimer, the term of this patent is extended or adjusted under 35 U.S.C. 154(b) by 91 days.

(21) Appl. No.: 15/086,813

(22) Filed: Mar. 31, 2016

(65) Prior Publication Data

US 2017/0084395 A1 Mar. 23, 2017

Related U.S. Application Data

(60) Provisional application No. 62/221,495, filed on Sep. 21, 2015.

(51) Int. Cl.
| | |
|---|---|
| *H01G 4/30* | (2006.01) |
| *A62C 31/22* | (2006.01) |
| *H01G 4/12* | (2006.01) |
| *H05K 1/18* | (2006.01) |
| *A62C 33/04* | (2006.01) |
| *F16L 5/04* | (2006.01) |
| *H01G 4/38* | (2006.01) |
| *H01G 4/012* | (2006.01) |
| *H01G 4/232* | (2006.01) |
| *A62C 31/02* | (2006.01) |
| *E06B 5/16* | (2006.01) |

(52) U.S. Cl.
CPC .............. *A62C 31/22* (2013.01); *A62C 33/04* (2013.01); *E06B 5/162* (2013.01); *F16L 5/04* (2013.01); *H01G 4/012* (2013.01); *H01G 4/1218* (2013.01); *H01G 4/232* (2013.01); *H01G 4/30* (2013.01); *H01G 4/38* (2013.01); *H05K 1/18* (2013.01); *A62C 31/02* (2013.01); *E06B 5/16* (2013.01); *H05K 2201/10015* (2013.01)

(58) Field of Classification Search
CPC .......... H01G 4/30; H01G 4/005; H01G 4/012; H01G 4/12; H01G 4/232; H01G 4/40; H01G 4/008; H01G 4/228
See application file for complete search history.

(56) References Cited

U.S. PATENT DOCUMENTS

| | | | |
|---|---|---|---|
| 6,570,411 B1 | 5/2003 | Bardsley et al. | |
| 6,819,543 B2 * | 11/2004 | Vieweg | H01G 4/385 257/E21.018 |

(Continued)

*Primary Examiner* — Nguyen Ha
(74) *Attorney, Agent, or Firm* — Fletcher Yoder PC

(57) ABSTRACT

This application relates to capacitors that resist deformation because of the configuration of their conductive and dielectric layers. The capacitors are multilayer capacitors that include multiple dielectric and conductive layers. The dielectric layers can be arranged in a way that creates a rigid barrier or dead zone, which can resist mechanical deformation when the multilayer capacitor is charged. In some embodiments, two or more multilayer capacitors are stacked together in an arrangement that causes each of the multilayer capacitors to cancel any deformations of the other when the multilayer capacitors are charged. In this way, noise exhibited by the multilayer capacitors can be reduced.

15 Claims, 11 Drawing Sheets

(56) References Cited

U.S. PATENT DOCUMENTS

| | | |
|---|---|---|
| 8,564,966 B2 | 10/2013 | Kitagawa et al. |
| 2006/0120020 A1* | 6/2006 | Dowgiallo, Jr. ......... H01G 4/12 |
| | | 361/313 |
| 2006/0139123 A1 | 6/2006 | Tang |
| 2015/0016014 A1* | 1/2015 | Park ...................... H01G 2/065 |
| | | 361/301.4 |
| 2015/0146340 A1* | 5/2015 | Yun ....................... H01G 4/012 |
| | | 361/301.4 |

* cited by examiner

FIG. 9A     FIG. 9B

CAPACITOR STRUCTURE WITH ACOUSTIC NOISE SELF-CANCELING CHARACTERISTICS

CROSS-REFERENCE TO RELATED APPLICATION

The present application claims the benefit of U.S. Provisional Application No. 62/221,495, entitled "CAPACITOR STRUCTURE WITH ACOUSTIC NOISE SELF-CANCELING CHARACTERISTICS," filed Sep. 21, 2015, the content of which is incorporated herein by reference in its entirety for all purposes.

FIELD

The described embodiments relate generally to capacitors. More particularly, the present embodiments relate to multilayer capacitors having layers that are arranged to reduce acoustic noise generated when the multilayer capacitors are operated.

BACKGROUND

Computing devices incorporate a variety of components that can each occasionally interfere with the operation of other components. Furthermore, some components can interfere with the user experience by, for example, generating audible noise. An example of such components includes capacitors, which can vibrate when a voltage is applied to them. The vibrations can occur at an audible frequency, which can be heard by users of a computing device in which the capacitors are operating. Unfortunately, designing capacitors to effectively provide adequate charge storage without creating audible noise can prove difficult when designing for smaller devices.

SUMMARY

This paper describes various embodiments that relate to capacitors that have noise canceling properties. In some embodiments, a multilayer capacitor is set forth. The multilayer capacitor can include conductive layers connected to terminals of the multilayer capacitor. Additionally, the multilayer capacitor can include dielectric layers disposed between the conductive layers. A portion of the dielectric layers can form a dielectric barrier that extends through the conductive layers and resists deformation of the multilayer capacitor when the multilayer capacitor is receiving a charge. The conductive layers can be monolithically bonded to the dielectric layers.

In other embodiments, a circuit is set forth. The circuit can include a circuit board and a multilayer capacitor connected to the circuit board. The multilayer capacitor can include at least two arrays of conductive electrodes that extend in different directions to resist deformations that can occur when the multilayer capacitor is receiving a charge. The at last two arrays of conductive electrodes include a first conductive electrode having a first surface that faces substantially perpendicular to a second surface of a second conductive electrode.

In yet other embodiments, a computing device is set forth. The computing device can include a circuit board and a capacitor connected to the circuit board. The capacitor can include a conductive layer comprising two conductive edges that are across from each other and separated by a dielectric barrier that extends through a portion of the capacitor. A width of separation of the two conductive edges is less than 100 microns, or 60 microns plus or minus 10 microns.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements.

FIGS. 9A-9C illustrate cut away views of various embodiments of the conductive electrodes that can be incorporated into a multilayer capacitor.

DETAILED DESCRIPTION

Figure 1A:
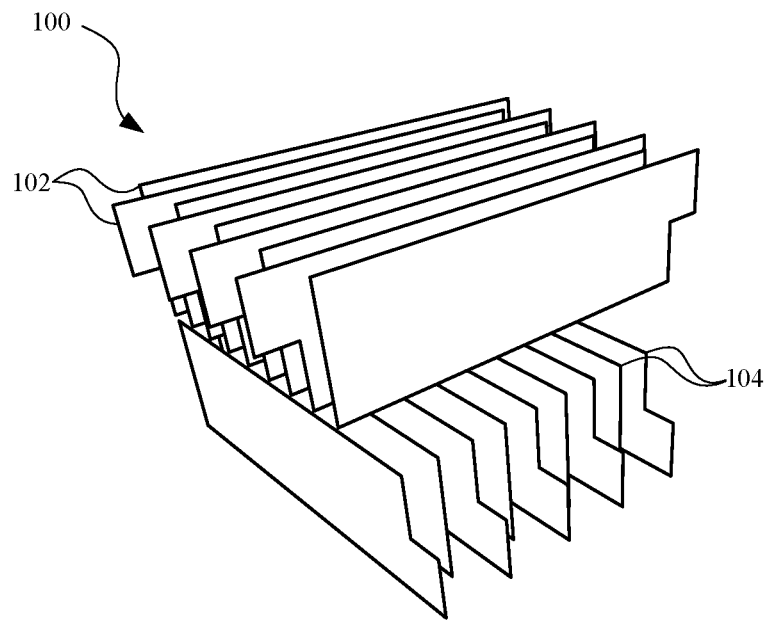
FIG. 1A illustrates a perspective view of conductive electrodes that can be incorporated into a multilayer capacitor according to some embodiments discussed herein.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

The described embodiments relate to capacitors that have self-canceling noise characteristics. Many capacitors exhibit vibrations during operation because of their piezoelectric properties. As a result, capacitors can generate noise within an audible frequency range. When such capacitors are incorporated into certain consumer electronics, the generated noise can be heard by users of the electronics and interfere with the user experience. In order to reduce the amount of noise generated by a capacitor, the capacitors can be designed to cancel out the noise according to the embodiments discussed herein.

In some embodiments, a multilayer capacitor is set forth. The multilayer capacitor can include multiple monolithically bonded capacitors separated by one or more dielectric structures. Each of the capacitors within the multilayer capacitor can be arranged to deform in different directions in order to cancel out or counter the deformations of each other. For example, when one of the capacitors within the multilayer capacitor is charged or polarized, the capacitor can experience a deformation in an x-direction, y-direction, and/or z-direction. In order to counter the deformation, another capacitor can be connected to the capacitor to restrict the deformation of the capacitor. The other capacitor can be arranged to deform in an opposite or otherwise different direction than the direction of the deformation of the capacitor. The number of capacitors that can be arranged within the multilayer capacitor can be unlimited depending on the amount of noise to be canceled. For example, in some embodiments, two capacitors are connected within the multilayer capacitor, and in other embodiments, at least three capacitors are connected within the multilayer capacitor.

In embodiments where at least two capacitors (e.g., C1 and C2) are connected within the multilayer capacitor, the electrodes of the two capacitors can extend in different directions to improve noise reduction. For example, the two capacitors can be stacked vertically relative to each other (e.g., stacked vertically in a z-direction). The electrodes of each capacitor C1 and C2 can be arranged parallel to an x-z plane and/or a y-z plane, and the electrodes of C1 can extend perpendicular to the electrodes of C2. In this way, any deformations or piezoelectric distortions of C1 can be countered by the deformations or piezoelectric distortions of C2 when the multilayer capacitor is charged.

In embodiments where at least three capacitors (e.g., C1, C2, and C3) are connected within the multilayer capacitor, the electrodes of each capacitor can be oriented differently to improve noise reduction. For example, capacitors C1, C2, and C3 can be vertically stacked relative to each other. The capacitors can be monolithically bonded and separated by a dielectric layer that is composed of the same or a different material than the dielectric material that is included in one of the capacitors C 1, C2, and C3. The capacitor C2 can be disposed between the capacitors C1 and C3, and can include electrodes that are horizontally oriented (e.g., parallel to an x-y plane). Furthermore, the capacitors C1 and C3 can include electrodes that are vertically oriented (e.g., parallel to an x-z plane and/or y-z plane). Each of the capacitors C1, C2, and C3 can be electrically connected and monolithically bonded. In this way, the mechanical forces created when each capacitor is polarized can effectively be canceled out when summed, thereby reducing the amount of acoustic noise that would otherwise be generated.

In some embodiments, the multilayer capacitor can include one or more dielectric barriers or dead zones composed of at least partially non-plated dielectric layers that act to restrict deformation of the multilayer capacitor when the multilayer capacitor is polarized or otherwise receives a charge. Because the non-plated dielectric layers are monolithically bonded to the electrodes, they provide additional rigidity to the multilayer capacitor without inducing any piezoelectric effects when the multilayer capacitor is polarized. A dielectric barrier can be arranged within the multilayer capacitor in a variety of ways. The dielectric barrier can also take a variety of shapes, and multiple dielectric barriers of the same shape or different shapes can be incorporated into the multilayer capacitor. For example, in some embodiments, the dielectric barrier is a wall that extends between two or more capacitors of the multilayer capacitor. In other embodiments, the dielectric barrier is a wall that extends partially into a capacitor of the multilayer capacitor. In yet other embodiments, the dielectric barrier can be one or more pillars or columns in the center, the side, and/or the corner of the multilayer capacitor. The ceramic barrier can extend in one or more directions not limited to an x-direction, y-direction, and/or z-direction. Moreover, a cross section of at least a portion of a dielectric barrier can be a cross, circle, oval, line, square, polygon, or any combination thereof. Furthermore, non-plated dielectric layers can be different per layer of the multilayer capacitor. In one example, a non-plated dielectric layer can be cross-shaped and another layer of the non-plated dielectric layer can be a polygon at a corner or side of the multilayer capacitor. In another example, a non-plated dielectric layer can form a circle and another layer of the non-plated dielectric layer can form a larger or smaller circle than the circle of the non-plated dielectric layer. However, it should be noted that any combination of layers and shapes of layers is within the scope of this disclosure.

These and other embodiments are discussed below with reference to FIGS. 1A-11; however, those skilled in the art will readily appreciate that the detailed description given herein with respect to these figures is for explanatory purposes only and should not be construed as limiting.

Figure 1B:
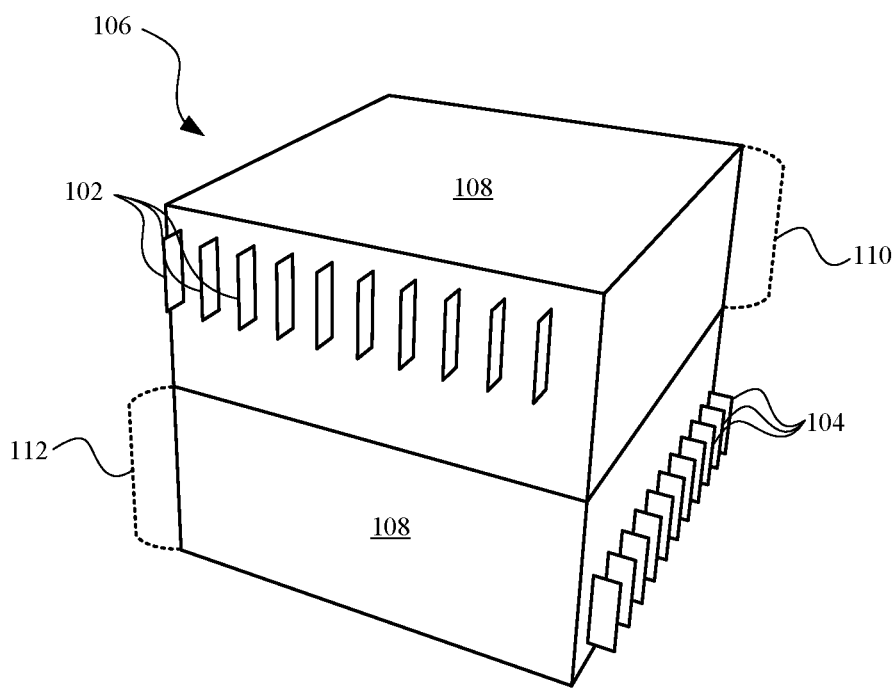
FIG. 1B illustrates a perspective view of each of the first array of conductive electrodes and the second array of conductive electrodes that can be printed on one or more dielectric layers.

FIG. 1A illustrates a perspective view 100 of conductive electrodes that can be incorporated into a multilayer capacitor according to some embodiments discussed herein. Specifically, FIG. 1A includes a first array of conductive electrodes 102 and a second array of conductive electrodes 104. The first array of conductive electrodes 102 can be arranged in a different direction than the second array of conductive electrodes 104. FIG. 1B illustrates a perspective view 106 of each of the first array of conductive electrodes 102 and the second array of conductive electrodes 104 printed onto stacked dielectric layers 108. In this way, a first capacitor 110 and a second capacitor 112 are created in an arrangement where the capacitors are monolithically joined. Portions of the first array of conductive electrodes 102 and the second array of conductive electrodes 104 can extend out of the dielectric 108 to create terminals, which can be soldered together, or otherwise coated with a conductive material, as illustrated in FIG. 2.

Figure 2:
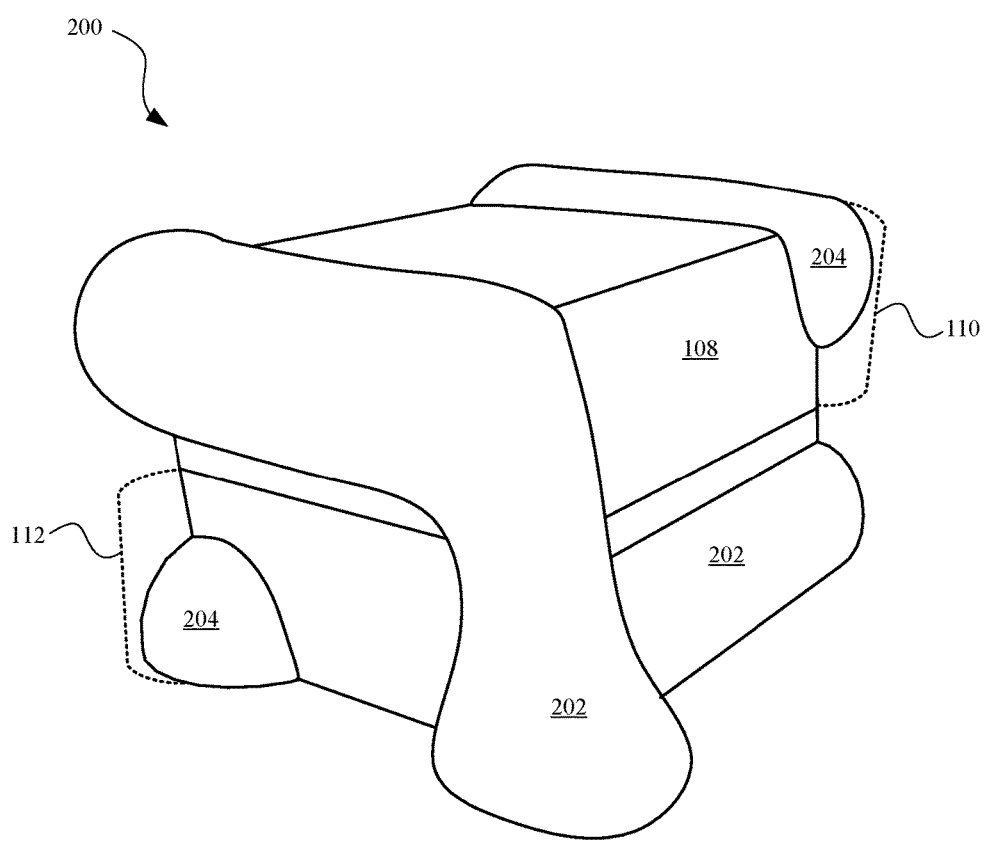
FIG. 2 illustrates a perspective view of a multilayer capacitor arranged according to some embodiments discussed herein.

FIG. 2 illustrates a perspective view 200 of a multilayer capacitor arranged according to some embodiments discussed herein. The multilayer capacitor of FIG. 2 includes the first array of conductive electrodes 102 and the second array of conductive electrodes 104 illustrated in FIGS. 1A and 1B. However, the terminals extending from the dielectric 108 are soldered together in FIG. 2 to create a first terminal 202 and a second terminal 204. In this way, both the first capacitor 110 and the second capacitor 112 can be charged when the first terminal 202 and the second terminal 204 receive a voltage. Additionally, because of the arrangement of the first array of conductive electrodes 102 and the second array of conductive electrodes 104, the first capacitor 110 and the second capacitor 112 will deform in different directions when receiving the voltage. As a result, an amount of deformation of the multilayer capacitor is reduced, compared to a capacitor having electrodes that are all arranged in the same direction. The reduction in deformation results in less noise generated during operation of the multilayer capacitor provided in FIG. 2. Furthermore, when the multilayer capacitor is connected to a circuit, less voltage will be induced in the circuit when the multilayer capacitor receives a vibration. When less voltage is induced in the circuit as a result of vibration, performance of the circuit is improved.

Figure 3A:
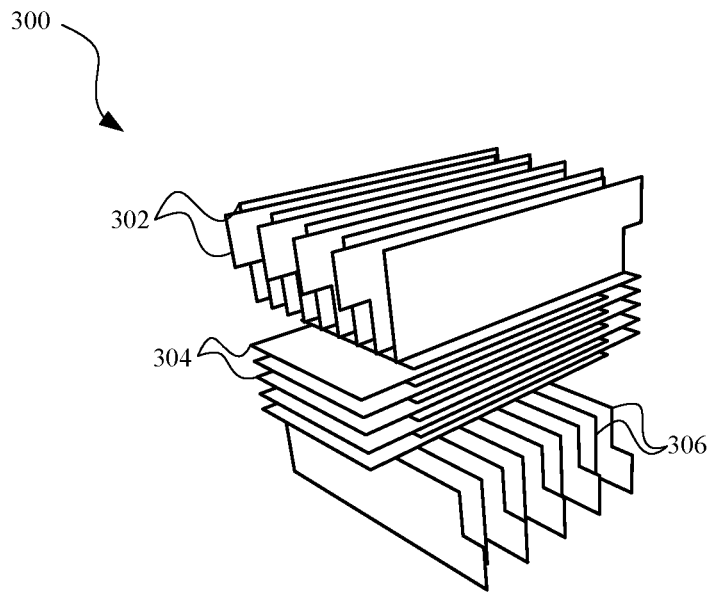
FIG. 3A illustrates a perspective view of conductive electrodes that can be incorporated into a multilayer capacitor according to some embodiments discussed herein.
Figure 3B:
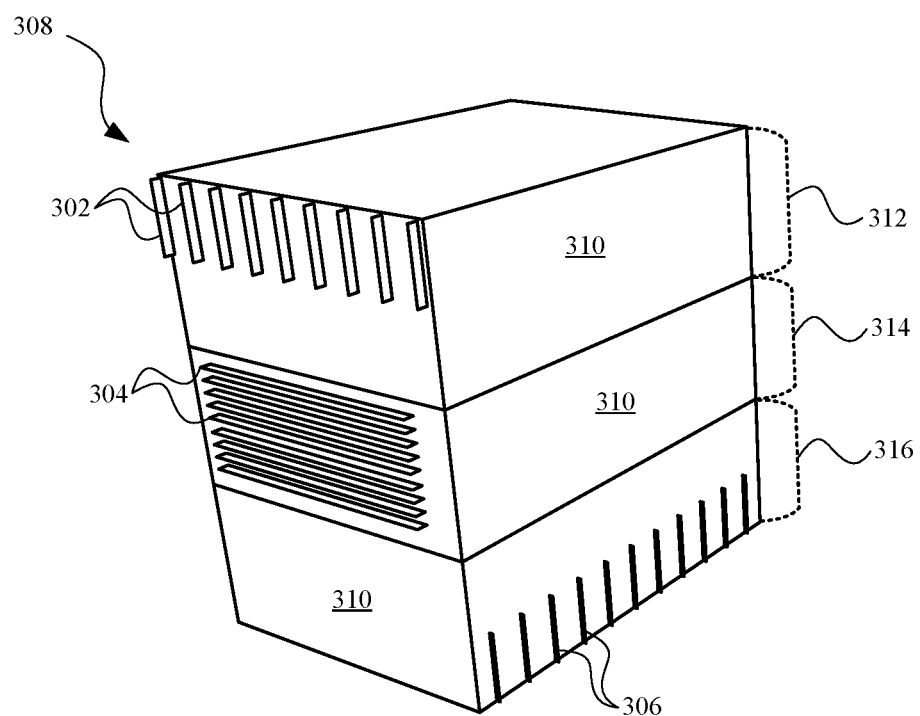
FIG. 3B illustrates a perspective view of multiple arrays of electrodes printed onto multiple dielectric layers.

FIG. 3A illustrates a perspective view 300 of conductive electrodes that can be incorporated into a multilayer capacitor according to some embodiments discussed herein. Specifically, FIG. 3A includes a first array of electrodes 302, a second array of electrodes 304, and a third array of electrodes 306. The first array of electrodes 302 can be arranged in a different orientation than the second array of electrodes 304 and the third array of electrodes 306. FIG. 3B illustrates a perspective view 308 of the first array of electrodes 302, the second array of electrodes 304, and the third array of electrodes 306 printed onto multiple dielectric layers 310. In this way, a first capacitor 312, a second capacitor 314, and a third capacitor 316 are created in an arrangement where the capacitors are monolithically joined. Portions of the first array of electrodes 302, the second array of electrodes 304, and the third array of electrodes 306 can extend out of the dielectric 310 to create terminals, which can be soldered together as illustrated in FIG. 4.

Figure 4:
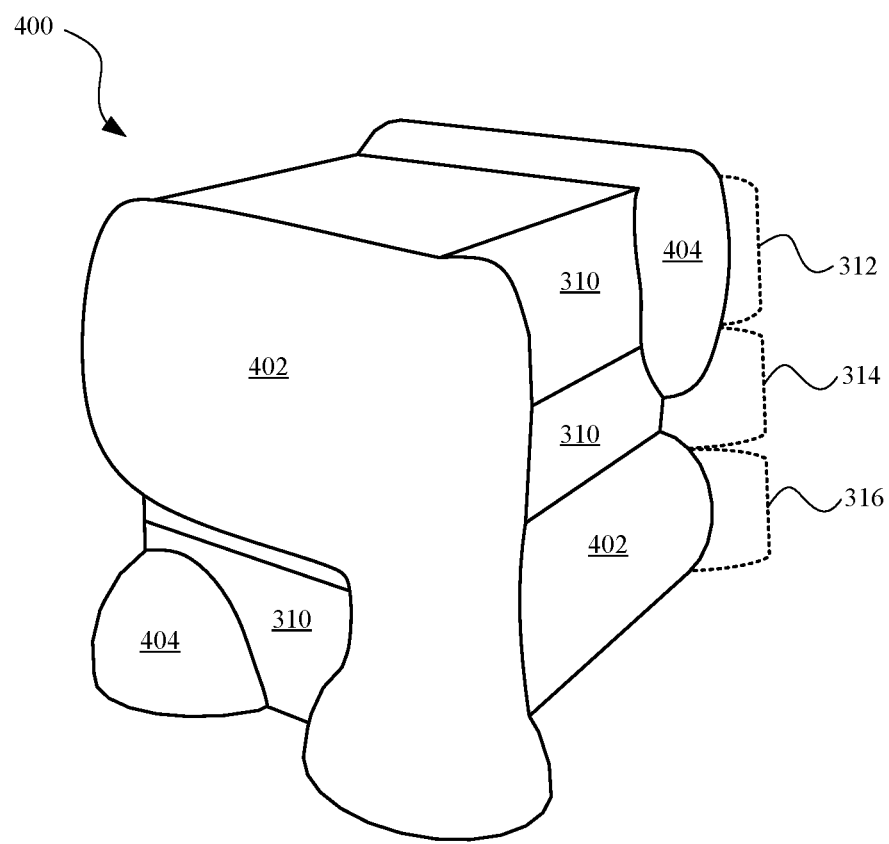
FIG. 4 illustrates a perspective view of a multilayer capacitor arranged according to some embodiments discussed herein.

FIG. 4 illustrates a perspective view 400 of a multilayer capacitor arranged according to some embodiments discussed herein. The multilayer capacitor of FIG. 4 can include the first array of electrodes 302, the second array of electrodes 304, and the third array of electrodes 306 illustrated in FIGS. 3A and 3B. However, the terminals extending from the dielectric 310 are soldered together in FIG. 4 to create a first terminal 402 and a second terminal 404. In this way, the first capacitor 312, the second capacitor 314, and the third capacitor 316 can be charged when the first terminal 402 and the second terminal 404 receive a voltage. Additionally, because of the arrangement of the first array of electrodes 302, the second array of electrodes 304, and the third array of electrodes 306, the first capacitor 312, the second capacitor 314, and the third capacitor 316 will deform in different directions when receiving the voltage. As a result, an amount of deformation of the multilayer capacitor is reduced, compared to a capacitor having electrodes that are all arranged in the same direction, as discussed herein.

Figure 5A:
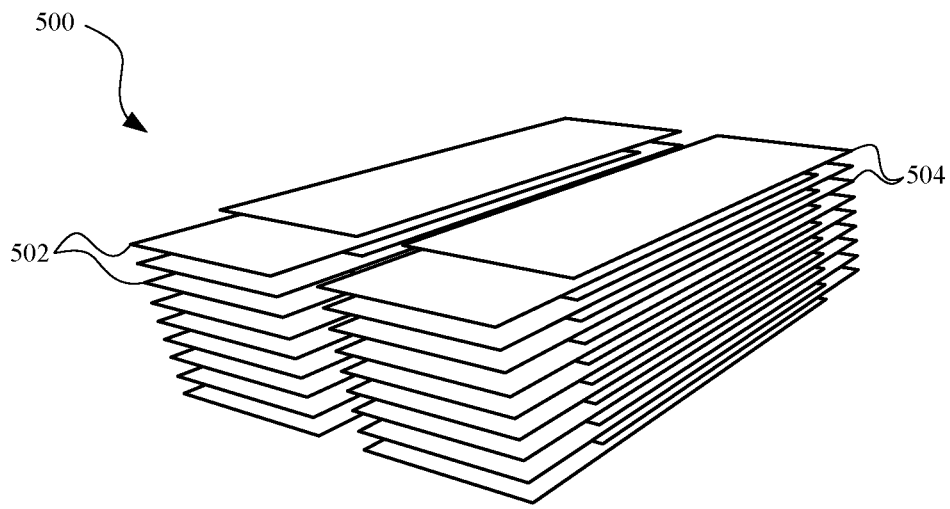
FIGS. 5A-5B illustrates a perspective view of conductive electrodes that can be incorporated into a multilayer capacitor to create a dead zone within the multilayer capacitor.
Figure 5B:
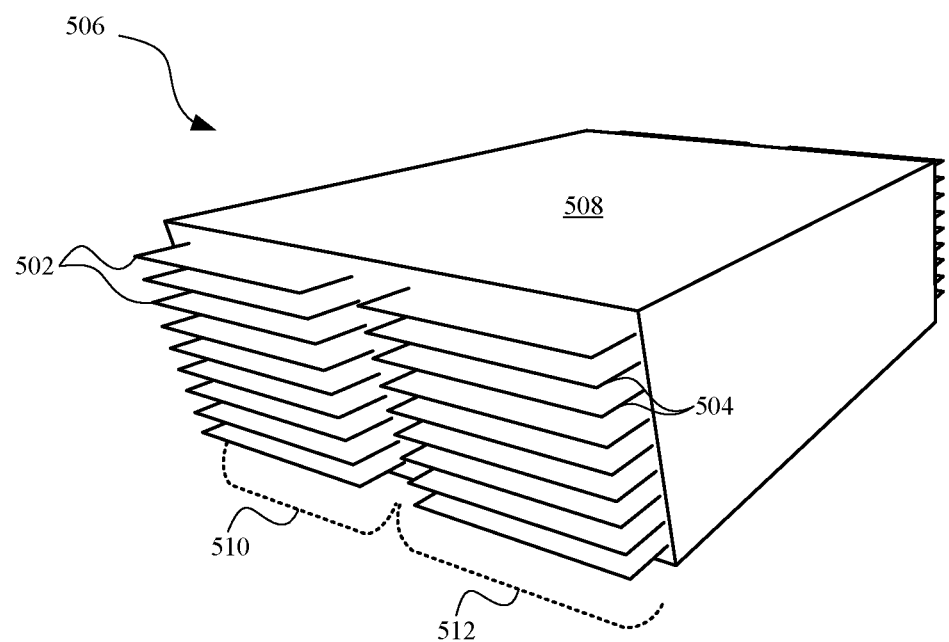

FIG. 5A illustrates a perspective view 500 of conductive electrodes that can be printed onto one or more dielectric layers and incorporated into a multilayer capacitor according to some embodiments discussed herein. Specifically, FIG. 5A includes a first array of conductive electrodes 502 adjacent to a second array of conductive electrodes 504. The electrodes of each array of conductive electrodes partially overlap each other. In this way, the ends of some electrodes overlap at least some of the ends of the other electrodes within the same array. This is useful when creating terminals of the capacitor in which the array of electrodes is disposed. FIG. 5B illustrates a perspective view 506 of a multilayer capacitor that includes the first array of conductive electrodes 502 and the second array of conductive electrodes 504 printed and stacked onto multiple dielectric layers 508. By printing the first array of conductive electrodes 502 and the second array of conductive electrodes 504 onto the dielectric layers 508, a first capacitor 510 and a second capacitor 512 are formed within the multilayer capacitor. Because of the separation of the first array of conductive electrodes 502 and the second array of conductive electrodes 504 within the multilayer capacitor of FIG. 5B, a dead zone can be created between the first capacitor 510 and the second capacitor 512. The dead zone refers to an area of the multilayer capacitor that resists movement when one or more of the first capacitor 510 and the second capacitor 512 are charged. The dead zone can be made of the same material as the dielectric layers 508 or a different material, as seen in FIG. 6A.

Figure 6A:
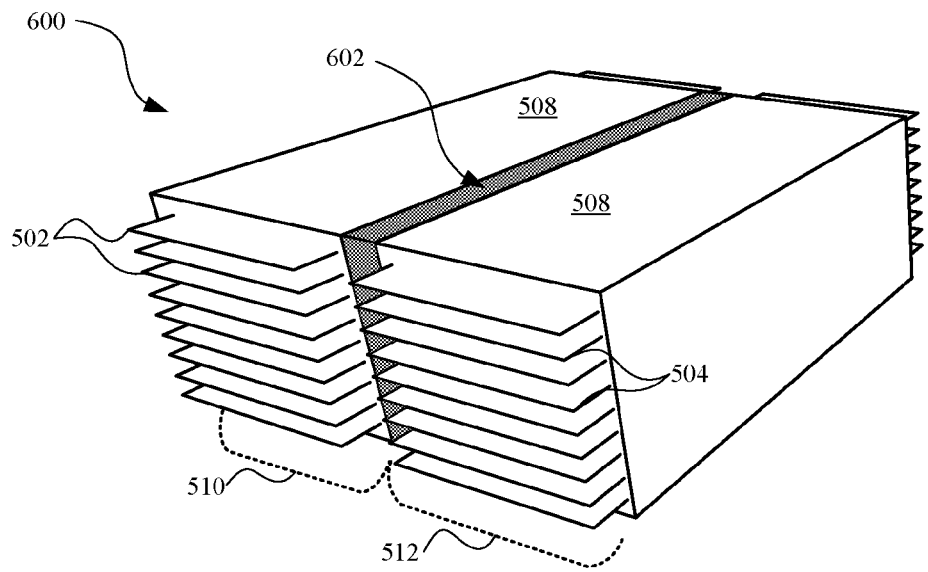
FIGS. 6A-6B illustrate perspective views of a multilayer capacitor with a dead zone to resist deformation of the multilayer capacitor.
Figure 6B:
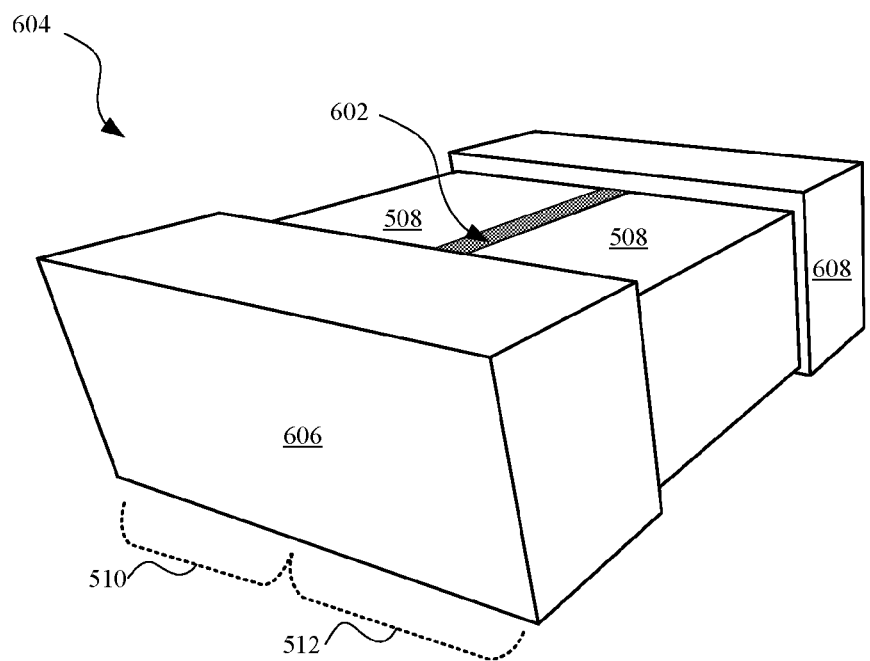

FIG. 6A illustrates a perspective view 600 of a multilayer capacitor with a dead zone 602 to resist deformation of the multilayer capacitor. The dead zone 602 can be formed from the same material as the dielectric layers 508 or a different material that is more or less rigid than the dielectric layers 508. The dead zone 602 can have a width of 100 microns or less. In some embodiments, the dead zone 602 can have a width of 60 microns, plus or minus 10 microns. The width of the dead zone 602 can be a distance between the first array of conductive electrodes 502 and the second array of conductive electrodes 504. Furthermore, each of the first capacitor 510 and the second capacitor 512 can be arranged to deform in different or opposing directions when receiving a charge or voltage. A first terminal 606 and a second terminal 608 can be created at the multilayer capacitor illustrated in the perspective view 604 of FIG. 6B. The first terminal 606 and the second terminal 608 can be formed from solder or other conductive bonding material in order to create a conductive pathway between the first array of conductive electrodes 502 and the second array of conductive electrodes 504. In this way, when the first terminal 606 and the second terminal 608 receive a charge, the first capacitor 510 and the second capacitor 512 will deform in different directions, and their deformation will be physically resisted by the dead zone 602.

Figure 7A:
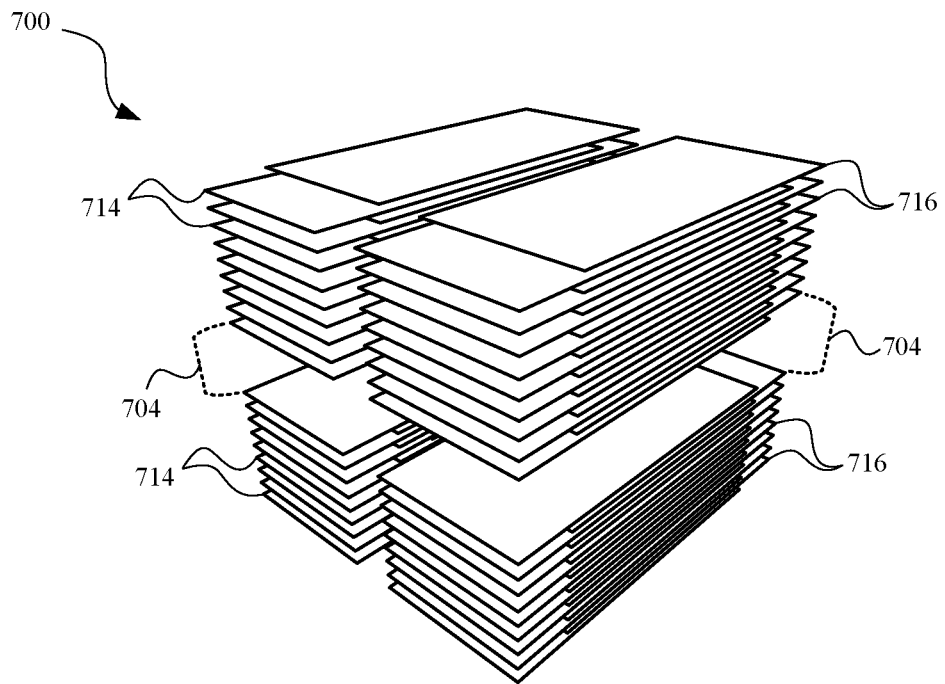
FIGS. 7A-7B illustrate perspectives view of a multilayer capacitor that includes a dead zone that extends in at least two directions.
Figure 7B:
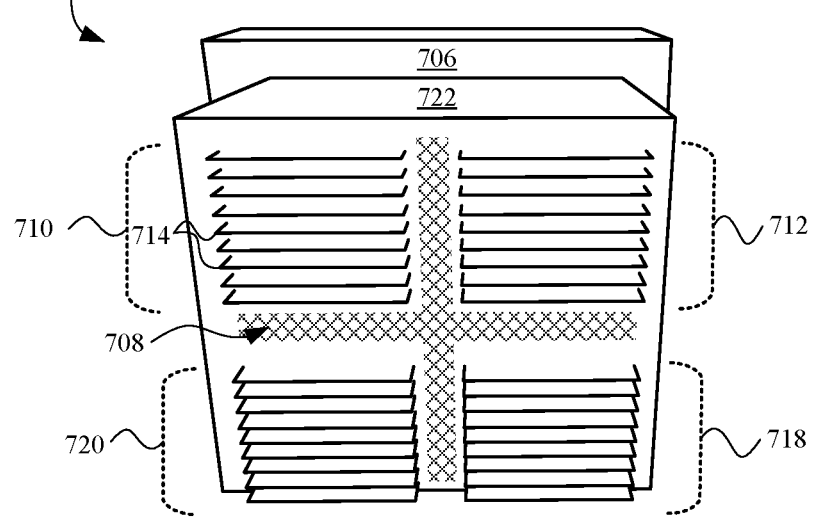

FIG. 7A illustrates a perspective view 700 of conductive electrodes that can be incorporated into a multilayer capacitor in an arrangement that creates a dead zone in at least two directions. Specifically, FIG. 7A includes a first array of conductive electrodes 714 adjacent to a second array of conductive electrodes 716. The electrodes of each array of conductive electrodes partially overlap each other. In this way, the ends of some electrodes overlap at least some of the ends of the other electrodes within the same array. This is useful when creating terminals of the capacitor in which the array of electrodes is disposed. Furthermore, the first array of conductive electrodes 714 and the second array of conductive electrodes 716 can be arranged in groups in order to leave a gap or space between groups, thereby creating a dead zone 704. When the groups of the first array of conductive electrodes 714 and the second array of conductive electrodes 716 are printed on the dielectric layers 722 and thereafter stacked, cut, and baked, a dielectric dead zone 708 can be created, as illustrated in FIG. 7B. Specifically, FIG. 7B illustrates a perspective view 702 of a cross section of a multilayer capacitor that includes the dielectric dead zone 708 between groups of conductive electrodes. Each group of conductive electrodes, which are separated by the dielectric dead zone 708, can each create a capacitor within the multilayer capacitor. For example, a first capacitor 710, a second capacitor 712, a third capacitor 718, and a fourth capacitor 720 can be created within the multilayer capacitor. Conductive electrodes 714 and conductive electrodes 716 can extend from dielectric layers 722 of the multilayer capacitor to help create terminals for the first capacitor 710, the second capacitor 712, the third capacitor 718, and the fourth capacitor 720. The multilayer capacitor can be coated with a conductive material to create a conductive terminal 706, as illustrated in the cross section of FIG. 7B. When the terminals of the multilayer capacitor of FIG. 7B receive a charge or voltage, the dead zone 708 between the first capacitor 710, the second capacitor 712, the third capacitor 718, and the fourth capacitor 720 will resist deforming. As a result, any noise exhibited by the multilayer capacitor of FIG. 7B can be reduced, and the structural integrity of the multilayer capacitor can be improved.

Figures 8A, 8B:
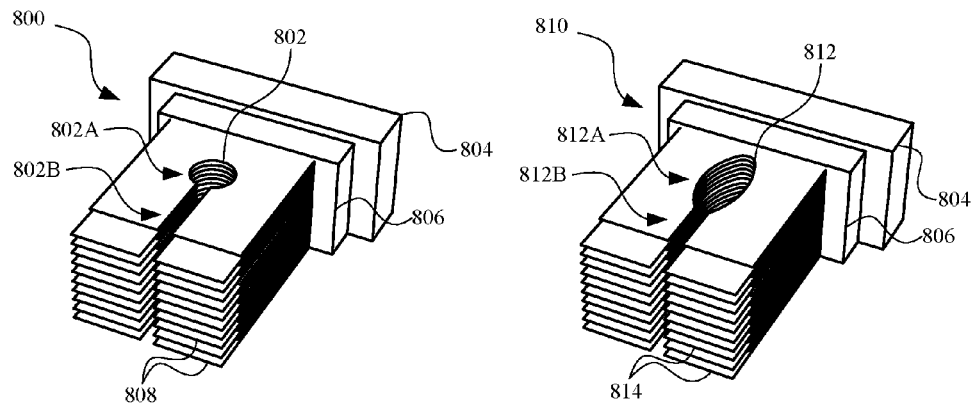
FIGS. 8A-8D illustrate cut away views of various embodiments of the conductive electrodes that can be incorporated into a multilayer capacitor.

FIG. 8A illustrates a cut away view 800 of a multilayer capacitor that includes a circular dead zone 802. When the multilayer capacitor is completely assembled, a dielectric layer 806 (e.g., ceramic layer) would envelope one or more conductive electrodes 808; however, the cut away view 800 illustrates dielectric layers 806 that are partially cut away and one of two terminals 804 of the multilayer capacitor removed to show the circular dead zone 802. The circular dead zone 802 can include a circular region 802A that is joined with a rectangular region 802B. The term dead zone can refer to a volume of the multilayer capacitor that does not include regions of conductive electrodes 808. In this way, when the conductive electrodes 808 are printed onto the dielectric layers 806, and thereafter stacked, pressed, cut, and baked, a dielectric barrier or dead zone will be created in the circular region 802A and the rectangular region 802B. Each of the conductive electrodes 808 can be printed onto at least one dielectric layer 806 to form the circular dead zone 802. The radius of the circular region 802A on each dielectric layer 806 can be constant or variable as each conductive electrode 808 is printed onto each dielectric layer 806. In this way, the circular dead zone 802 can resemble a circular column that has the same radius or a varying radius as the column extends through the multilayer capacitor. The circular dead zone 802 can resist deformation, which can occur when the multilayer capacitor of FIG. 8A is charged, thereby reducing an amount of acoustic noise exhibited by the multilayer capacitor.

FIG. 8B illustrates a cut away view 810 of a multilayer capacitor that includes an oval dead zone 812. The cut away view 810 illustrates dielectric layers 806 that are partially cut away and one of the two terminals 804 of the multilayer capacitor being removed to show the oval dead zone 812. The oval dead zone 812 can include an oval region 812A that is joined with a rectangular region 812B. In this way, when the conductive electrodes 814 are printed onto the dielectric layer 806, and thereafter stacked, pressed, cut, and baked, a dielectric barrier will be created in the oval region 812A and the rectangular region 812B. Each of the conductive electrodes 814 can be printed onto at least one dielectric layer 806 to form the oval dead zone 812. The dimensions of the oval printed onto each dielectric layer 806 can be constant or variable as each conductive electrode 808 is printed onto the dielectric layers 806. In this way, the oval dead zone 812 can resemble an oval column that has the same dimensions or a varying dimensions as the column extends through the multilayer capacitor. As a result, the oval dead zone 812 can resist deformation, which can occur when the multilayer capacitor of FIG. 8B is charged, thereby reducing an amount of acoustic noise exhibited by the multilayer capacitor.

Figures 8C, 8D:
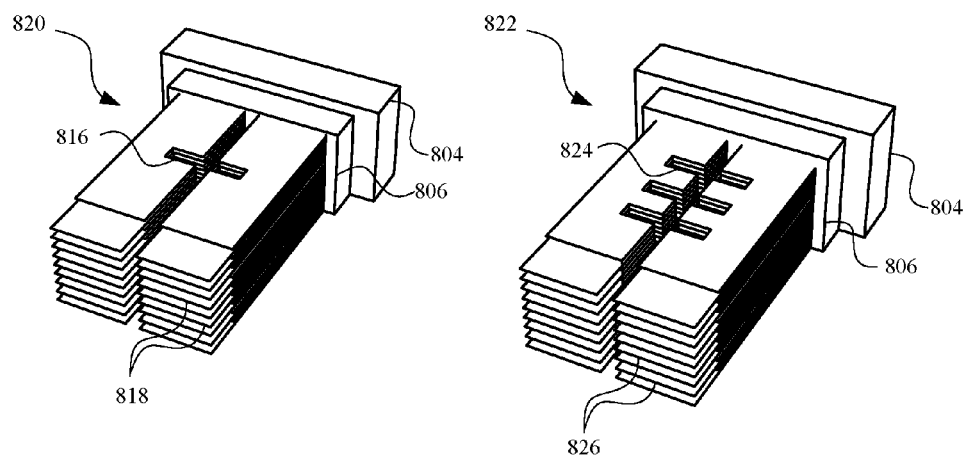

FIG. 8C illustrates a cut away view 820 of a multilayer capacitor that includes a cross dead zone 816. The cut away view 820 illustrates dielectric layers 806 that are partially cut away and one of the two terminals 804 of the multilayer capacitor being removed to show the cross dead zone 816. The cross dead zone 816 can be defined by a conductive electrode 818 that is printed onto a dielectric layer 806 such that a cross-shaped region on the dielectric layer 806 does not include conductive material. In this way, when the conductive electrodes 818 are printed onto the dielectric layers 806, and thereafter stacked, pressed, cut, and baked, a dielectric barrier will extend through the conductive electrodes 818. The dimensions of the cross dead zone 816 printed on each of the dielectric layers 806 can be constant or variable as each conductive electrode 818 is printed onto each dielectric layer 806. In this way, the cross dead zone 816 can resemble intersecting walls that have the same dimensions or varying dimensions as the walls extend through the multilayer capacitor. As a result, the cross dead zone 816 can resist deformation, which can occur when the multilayer capacitor of FIG. 8C is charged, thereby reducing an amount of acoustic noise exhibited by the multilayer capacitor.

FIG. 8D illustrates a cut away view 822 of a multilayer capacitor that includes a multi-cross dead zone 824. The cut away view 822 illustrates dielectric layers 806 that are partially cut away and one of the two terminals 804 of the multilayer capacitor being removed to show the multi-cross dead zone 824. The multi-cross dead zone 824 can be defined by a rectangle that is intersected by one or more other rectangles. The various rectangles of the multi-cross dead zone 824 can intersect at an angle of approximately 90 degrees, less than 90 degrees, or greater than 90 degrees. When the conductive electrodes 826 are printed onto the dielectric layer 806, and thereafter stacked, pressed, cut, and fired, a dielectric barrier will extend through the multiple cross-shaped regions of the conductive electrodes 826. Each of the conductive electrodes 826 can be printed onto each dielectric layer 806 to form the multi-cross dead zone 824. The dimensions of the crosses in each of the conductive electrodes 826 can be constant or variable as each conductive electrode 826 is printed and stacked. In this way, the multi-cross dead zone can resemble intersecting walls that have the same dimensions or varying dimensions as the walls extend through the multilayer capacitor. As a result, the multi-cross dead zone 824 can resist deformation, which can occur when the multilayer capacitor of FIG. 8C is charged, thereby reducing an amount of acoustic noise exhibited by the multilayer capacitor.

FIG. 9A illustrates a cut away view 900 of a multilayer capacitor that includes a circular dead zone 908. The cut away view 900 illustrates dielectric layers 806 that are partially cut away and one of the two terminals 804 of the multilayer capacitor removed to show the circular dead zone 908. The circular dead zone 908 can be defined by a circular region that is outlined by an edge of a conductive electrode 906, which is printed on a dielectric layer 806. When the conductive electrodes 906 are printed on the dielectric layers 806, and thereafter stacked, pressed, cut, and baked, a dielectric barrier will extend through the circular regions of each conductive electrode 906. In some embodiments, the multilayer capacitor can be arranged to include multiple dielectric barriers defined by multiple circular regions extending through different areas of the conductive electrodes 906. Each of the conductive electrodes 906 can be individually printed on the dielectric layers 806 to form the circular dead zone 908. The dimensions of the circular region in each of the conductive electrodes 906 can be constant or variable as each conductive electrode 906 is printed and stacked. In this way, the circular dead zone 908 can resemble a column having a constant or variable radius as the column extends through the multilayer capacitor of FIG. 9A. As a result, the circular dead zone 908 can resist deformation, which can occur when the multilayer capacitor of FIG. 9A is charged, thereby reducing an amount of acoustic noise exhibited by the multilayer capacitor.

FIG. 9B illustrates a cut away view 902 of a multilayer capacitor that includes an oval dead zone 910. The cut away view 902 illustrates dielectric layers 806 that are partially cut away and one of the two terminals 804 of the multilayer capacitor removed to show the oval dead zone 910. The oval dead zone 910 can be defined by an oval region that is outlined by an edge of the conductive electrode 912, which is printed on one or more dielectric layers 806. When the conductive electrodes 912 are printed on the dielectric layers 806, and thereafter stacked, pressed, cut, and baked, a dielectric barrier will extend through the oval regions of each conductive electrode 912. The dimensions of the oval region in each of the conductive electrodes 912 can be constant or variable as each conductive electrode 906 is printed onto each dielectric layer 806. In this way, the oval dead zone 910 can resemble a column having a constant or variable radius as the column extends through the multilayer capacitor of FIG. 9B. As a result, the oval dead zone 910 can resist deformation, which can occur when the multilayer capacitor of FIG. 9B is charged, thereby reducing an amount of acoustic noise exhibited by the multilayer capacitor.

Figure 9C:
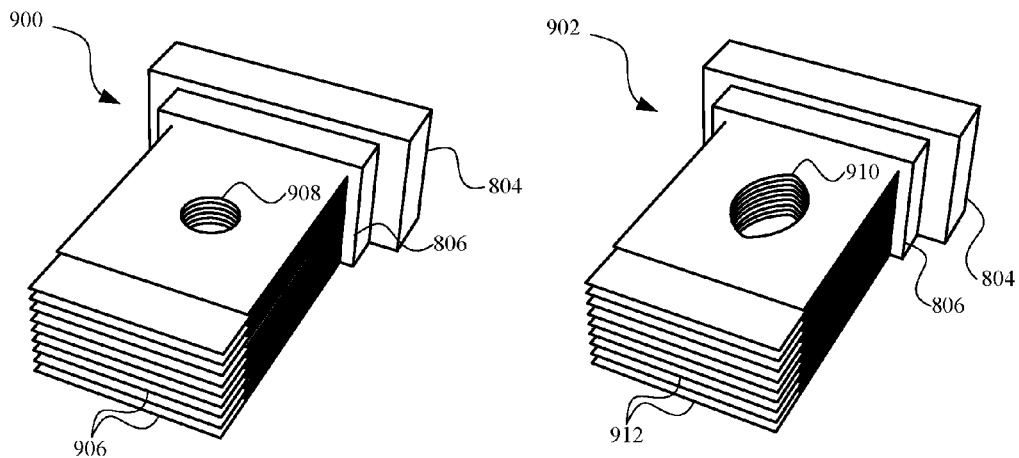
Figure 9C:
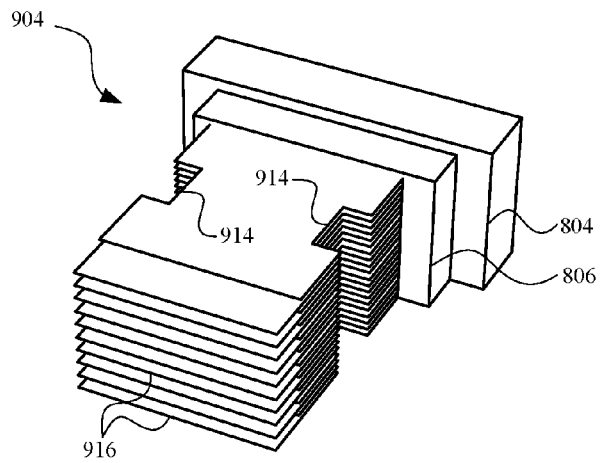

FIG. 9C illustrates a cut away view 904 of a multilayer capacitor that includes one or more perimeter dead zones 914. The cut away view 904 illustrates dielectric layers 806 that are partially cut away, and one of the two terminals 804 of the multilayer capacitor removed, to show the perimeter dead zones 914. The perimeter dead zones 914 can be defined by a printed edge of the conductive electrodes 916 that extends away from a boundary of at least one of the conductive electrodes 916. When the conductive electrodes 916 are printed onto the dielectric layer 806, and thereafter stacked, pressed, cut, and baked, a dielectric barrier will extend through each conductive electrode 916. Each of the conductive electrodes can be individually printed onto a dielectric layer 806 to form the perimeter dead zones 914. The dimensions of the conductive electrodes 916 can be constant or variable as each conductive electrode 916 is printed onto a dielectric layer 806. In this way, the perimeter dead zones 914 can resemble columns having constant or variable dimensions as the columns extend through the multilayer capacitor of FIG. 9C. As a result, the perimeter dead zones 914 can resist deformation, which can occur when the multilayer capacitor of FIG. 9C is charged, thereby reducing an amount of acoustic noise exhibited by the multilayer capacitor. It should be noted that any of the embodiments discussed herein, including those related to FIGS. 1A-9C can be modified and/or combined in any manner suitable for creating a capacitor that has noise cancelling properties. For example, any of the embodiments discussed with respect to FIGS. 8A-9C can be stacked or arranged according to the embodiments of FIGS. 2 and 4, or FIGS. 6A-7B.

Figure 10:
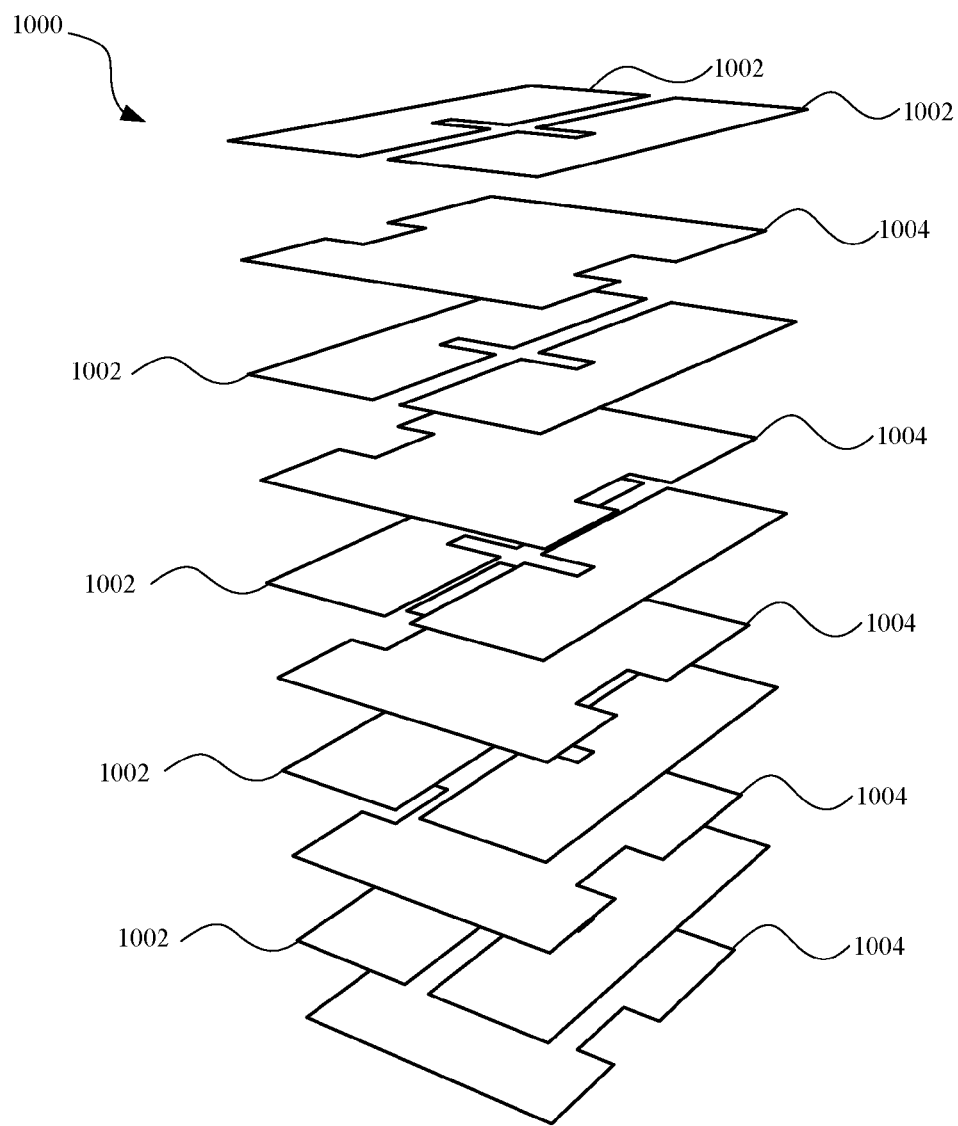
FIG. 10 illustrates an exploded view of an embodiment of a combination of conductive electrodes that can be incorporated into any of the multilayer capacitors discussed herein.

FIG. 10 illustrates an exploded view 1000 of an embodiment of a combination of conductive electrodes that can be incorporated into any of the multilayer capacitors discussed herein. Specifically, FIG. 10 illustrates a first conductive electrode 1002 that can be printed onto a dielectric layer (not shown) and arranged over a second conductive electrode 1004 within a multilayer capacitor. The first conductive electrode 1002 can be printed to have a cross-shaped cutout region and the second conductive electrode 1004 can be printed to have one or more cutout edge regions. As a result, a more rigid structure will be created for the multilayer capacitor when the first conductive electrode 1002 and the second conductive electrode 1004 are stacked. This arrangement causes the multilayer capacitor to resist deformation when the multilayer capacitor of FIG. 10 is charged. It should be noted that any combination of two or more different conductive electrodes can be printed and stacked to form a multilayer capacitor. For example, in some embodiments, a multilayer capacitor is arranged to include the conductive electrode 906 of FIG. 9A disposed over the conductive electrode 916 of FIG. 9C.

Figure 11:
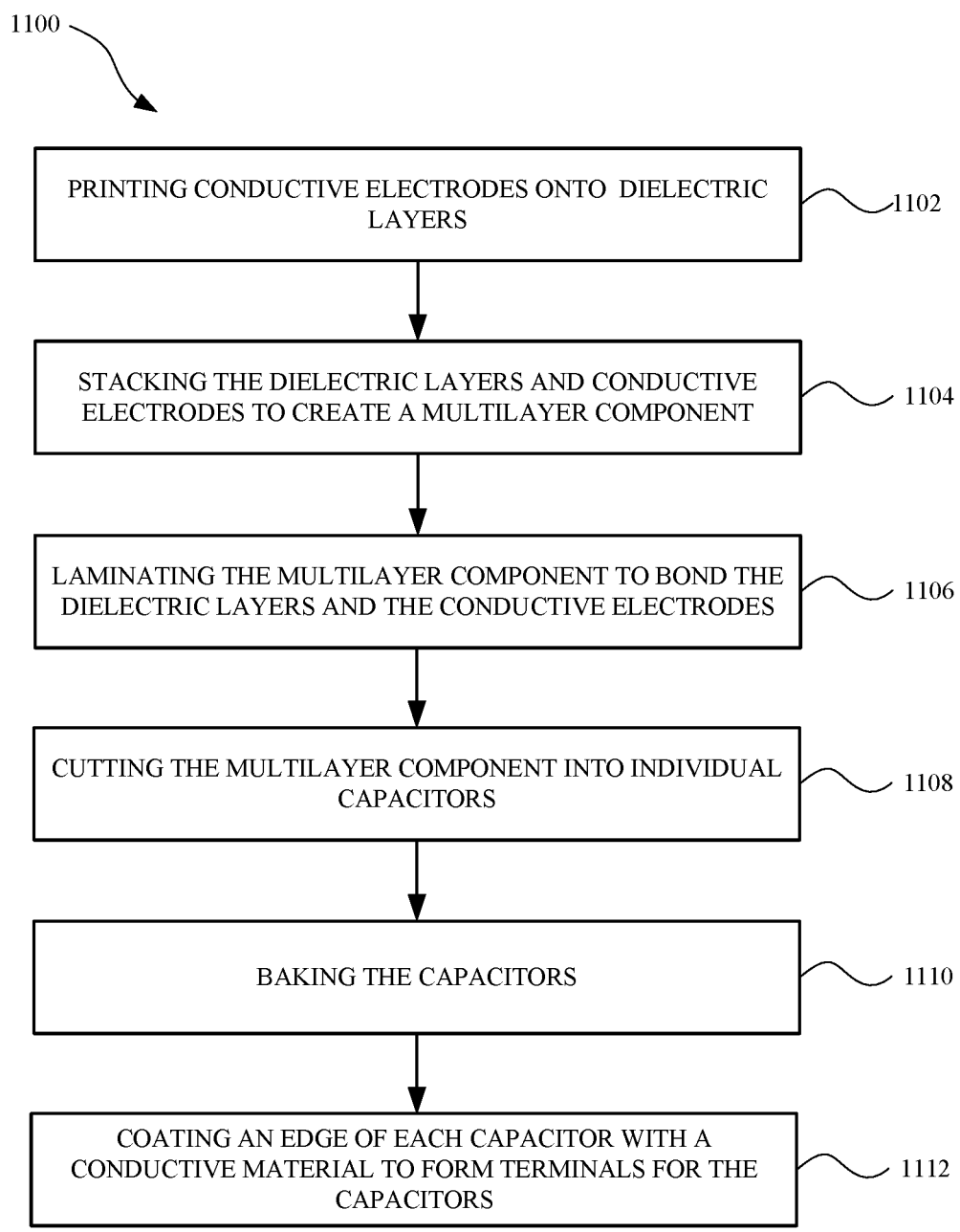
FIG. 11 illustrates a method for forming a multilayer capacitor according to any of the embodiments discussed herein.

FIG. 11 illustrates a method 1100 for forming a multilayer capacitor according to any of the embodiments discussed herein. The method 1100 can be performed by any computing, apparatus, or machine suitable for manufacturing capacitors. The method 1100 can include a step 1102 of printing conductive electrodes onto dielectric layers. Printing can be performed by applying a conductive ink onto one or more layers of dielectric material. The method 1100 can further include a step 1104 of stacking the dielectric layers and conductive electrodes to create a multilayer component. Thereafter, at step 1106, the multilayer component can be laminated for bonding the dielectric layers and the conductive electrodes. Laminating the multilayer component results in a monolithic bond between the multiple layers of conductive electrodes and dielectric layers. At step 1108, the multilayer component is cut into individual capacitors. In some embodiments, the individual capacitors can include at least 400 layers and have a capacitance of at least 15 microfarads. Furthermore, in some embodiments, the individual capacitors can have dimensions less than or equal to 1.2 millimeters in length, by 0.65 millimeters in width, and by 0.65 millimeters in height. Individual layers of dielectric and conductive material can each have a thickness of less than or equal to 0.5 micrometers. The method 1100 can further include a step of baking the individual capacitors in a kiln or other receptacle for baking or firing an electronic component. At step 1112, the capacitors can be coated with a conductive material to form terminals on the capacitors. For example, the coating process can be performed by electroplating the capacitors with a layer of the conductive material, such as nickel, tin, aluminum, alloy, and/or any other suitable material for creating a terminal. It should be noted that step 1112 can be repeated for creating any number of terminals for the capacitors.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data, which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description.

They are not intended to be exhaustive or to limit the described embodiments to the precise forms disclosed. It will be apparent to one of ordinary skill in the art that many modifications and variations are possible in view of the above teachings.

What is claimed is:

1. A multilayer capacitor, comprising:
    a first plurality of conductive layers, each conductive layer of the first plurality of conductive layers defining a respective first electrode and a respective second electrode, wherein each respective first electrode and each respective second electrode are connected to a first terminal of the multilayer capacitor and wherein each respective first electrode is spaced apart from each respective second electrode;
    a second plurality of conductive layers, each conductive layer of the second plurality of conductive layers defining a respective third electrode and a respective fourth electrode, wherein each respective third electrode and each respective fourth electrode are connected to a second terminal of the multilayer capacitor and wherein each respective third electrode is spaced apart from each respective fourth electrode; and
    a plurality of dielectric layers, each respective dielectric layer disposed between a first respective conductive layer from the first plurality of conductive layers and a second respective conductive layer from the second plurality of conductive layers, wherein a portion of each respective dielectric layer is disposed between the first and the second electrodes of the respective first conductive layer and between the third and the fourth electrodes of the respective second conductive layer such that the plurality of dielectric layers form a dielectric barrier that extends through the first and second plurality of conductive layers and from a top of the multilayer capacitor to a bottom of the multilayer capacitor and between each of the first and the second electrodes and each of the third and the fourth electrodes to resist deformation of the multilayer capacitor caused by the multilayer capacitor receiving a charge.

2. The multilayer capacitor of claim 1, wherein each conductive layer of the first plurality of conductive layers and the second plurality of conductive layers is monolithically bonded to a corresponding adjacent dielectric layers.

3. The multilayer capacitor of claim 1, wherein the dielectric barrier is cross shaped.

4. The multilayer capacitor of claim 1, wherein each dielectric layer of the plurality of dielectric layers comprises barium or titanium.

5. The multilayer capacitor of claim 1, wherein the dielectric barrier comprises a wall that bisects the multilayer capacitor.

6. The multilayer capacitor of claim 1, wherein a cross section of the dielectric barrier is defined by an inner edge of at least one conductive layer of the first or second plurality of conductive layers.

7. A method to produce a multilayer capacitor, comprising:
    printing a respective first conductive electrode onto each dielectric layer of a first plurality of dielectric layers, wherein each first conductive electrode is configured to couple a first terminal of the multilayer capacitor;
    printing a respective second conductive electrode onto each dielectric layer of the first plurality of dielectric layers, wherein each respective second conductive electrode is separated from each respective first conductive electrode, and wherein each second conductive electrode is configured to couple to the first terminal;
    printing a respective third conductive electrode onto each dielectric layer of a second plurality of dielectric layers, wherein each third conductive electrode is configured to couple a second terminal of the multilayer capacitor;
    printing a fourth respective conductive electrode onto each dielectric layer of the second plurality of dielectric layers, wherein the fourth conductive electrode is separated from the third conductive electrode, and wherein each fourth conductive electrode is configured to couple to the second terminal; and
    stacking the first plurality of dielectric layers and the second plurality of dielectric layers to form the multilayer capacitor, wherein the multilayer capacitor comprises a dielectric barrier that extends from a top to a bottom of the multilayer capacitor and between each respective first and second conductive electrodes and each respective third and fourth conductive electrodes, and wherein the dielectric barrier is configured to resist deformation of the multilayer capacitor caused by the multilayer capacitor receiving a charge.

8. The method of claim 7, wherein the dielectric barrier comprises a cross-shaped barrier, a circular barrier, an oval barrier, or a double cross-shaped barrier.

9. The method of claim 7, wherein the dielectric barrier comprises a wall that bisects the multilayer capacitor.

10. The method of claim 7, comprising coating a first edge of the multilayer capacitor to form the first terminal and coating a second edge of the multilayer capacitor to form the second terminal.

11. A multilayer ceramic capacitor, comprising:
    a first plurality of ceramic layers, each of the first plurality of ceramic layers having a first conductive portion and a second conductive portion, the first conductive portion being separated from the second conductive portion by a first intermediate ceramic portion of the ceramic layer, and each of the first and second conductive portions having a respective first and second terminal portions; and
    a second plurality of ceramic layers, each of the second plurality of ceramic layers having a third conductive portion and a fourth conductive portion, the third conductive portion being separated from the fourth conductive portion by a second intermediate ceramic portion of the ceramic layer, and each of the third and fourth conductive portions having a respective first and second terminal portions; and
    wherein each of the first plurality of ceramic layers is interposed between respective ceramic layers of the second plurality of ceramic layers such that each first intermediate ceramic portions of the first plurality of ceramic layers and each second intermediate ceramic portion of the second plurality of ceramic layers are aligned to form a dielectric barrier that extends from a top to a bottom of the multilayer ceramic capacitor between the respective first and second conductive portions of the first plurality of ceramic layers and between the respective third and fourth conductive portions of the second plurality of ceramic layers, wherein the first and second terminal portions of the first plurality of ceramic layers extend in a first direction, and wherein the first and second terminal portions of the second plurality of ceramic layers extend in a second direction different from the first direction.

12. The multilayer ceramic capacitor of claim 11, wherein the first conductive portions and the third conductive portions comprise a first capacitor of the multilayer ceramic capacitor, and wherein the second conductive portions and the fourth conductive portions comprise a second ceramic capacitor of the multilayer ceramic capacitor.

13. The multilayer ceramic capacitor of claim 11, wherein the dielectric barrier comprises a cross-shape, a circular shape, an oval shape, or a double-cross shape.

14. The multilayer ceramic capacitor of claim 11, wherein the ceramic layers of the first and second plurality of ceramic layers comprise barium, or titanium, or any combination thereof.

15. The multilayer ceramic capacitor of claim 11, comprising a first terminal configured to electrically couple to the first and second terminal portions of the first plurality of ceramic layers, and a second terminal configured to electrically couple to the first and second terminal portions of the second plurality of ceramic layers.

* * * * *